(12) United States Patent
Liebmann et al.

(10) Patent No.: US 6,602,728 B1
(45) Date of Patent: Aug. 5, 2003

(54) METHOD FOR GENERATING A PROXIMITY MODEL BASED ON PROXIMITY RULES

(75) Inventors: Lars W. Liebmann, Poughquag, NY (US); Scott Mansfield, Hopewell Junction, NY (US); Alfred K. Wong, Pokfulam (HK)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 09/754,920

(22) Filed: Jan. 5, 2001

(51) Int. Cl.[7] ........................... G01R 31/26; H01L 21/66
(52) U.S. Cl. ........................ 438/16; 438/14; 438/16; 716/5; 716/6; 716/19; 716/20; 716/21
(58) Field of Search ................... 438/15–16, 14, 438/780; 716/5–6, 9, 19, 20–21

(56) References Cited

U.S. PATENT DOCUMENTS

| | | | |
|---|---|---|---|
| 4,895,780 A | | 1/1990 | Nissan-Cohen et al. |
| 5,242,770 A | | 9/1993 | Chen et al. |
| 5,447,810 A | | 9/1995 | Chen et al. |
| 5,631,110 A | * | 5/1997 | Shioiri et al. ................ 430/5 |
| 5,636,002 A | | 6/1997 | Garofalo |
| 5,682,323 A | | 10/1997 | Pasch et al. |
| 5,725,974 A | * | 3/1998 | Kawahira ...................... 430/5 |
| 5,821,014 A | | 10/1998 | Chen et al. |
| 5,862,058 A | | 1/1999 | Samuels et al. |
| 5,902,703 A | * | 5/1999 | Leroux et al. ................ 430/5 |
| 5,958,635 A | | 9/1999 | Reich et al. |
| 5,965,306 A | * | 10/1999 | Mansfield et al. .......... 430/22 |
| 6,038,020 A | | 3/2000 | Tsukuda |
| 6,051,347 A | * | 4/2000 | Tzu et al. ...................... 3/99 |
| 6,180,293 B1 | * | 1/2001 | Tanaka et al. ................ 430/5 |
| 6,301,008 B1 | * | 10/2001 | Ziger et al. ................. 356/401 |
| 6,391,677 B1 | * | 5/2002 | Kamatsuki .................. 438/69 |
| 2002/0019729 A1 | * | 2/2002 | Chang et al. ................. 703/6 |
| 2002/0024714 A1 | * | 2/2002 | Sandstrom et al. ......... 359/290 |

OTHER PUBLICATIONS

Chuang, H et al. "Practical applications of 2–D optical proximity corrections for enhanced performance of 0.25 mu & m random logic devices" Electron devices meeting 1997 technical digest, International, 7–10 Dec. 19, 1997 p. 483–486.*

Ji–Soong Park et al. "An efficient rule–based OPC approach using a DRC tool for 0.18 um ASIC" Quality electronic design, 2000. ISQED 2000. IEEE proceedings first international symposium p. 81–85.*

* cited by examiner

Primary Examiner—Matthew S. Smith
Assistant Examiner—Granvill D Lee, Jr.
(74) Attorney, Agent, or Firm—Todd M. C. Li; McGuire Woods LLP

(57) ABSTRACT

A method for generating an optical proximity correction (OPC) model includes generating a set of correction rules for a wafer design containing at least one of lines and assist features, determining a set of corrections that need to be made over a range of sizes and spaces of the lines and assist features based on the set of correction rules, and creating an optical proximity correction model for correcting the wafer design based on the set of corrections.

13 Claims, 7 Drawing Sheets

| Si | Lj | Rij | Aij | Dij |
|---|---|---|---|---|
| 175 (Sr) | 175(Lr) | 125 | 150 | −25 |
| | 200 | 160 | 190 | −30 |
| | 225 | 195 | 230 | −35 |
| 200 | 175 | 123 | 149 | −26 |
| | 200 | 158 | 189 | −31 |
| | 225 | 193 | 229 | −36 |
| 225 | 175 | 120 | 147 | −27 |
| | 200 | 155 | 187 | −32 |
| | 225 | 190 | 227 | −37 |

NOTE: Si and Lj are on mask design grid (25nm).

FIG. 6A

| Si | Lj | Rij | Aij | Dij |
|---|---|---|---|---|
| 175 (Sr) | 125(Rr) | 175(Lrr) | 150 | −25 |
| | 160 | 200(Lrj) | 190 | −30 |
| | 195 | 225(Lrj) | 230 | −35 |
| 200 | 125 | 176 | 152 | −27 |
| | 160 | 201 | 192 | −32 |
| | 195 | 226 | 232 | −37 |
| 225 | 125 | 178 | 154 | −29 |
| | 160 | 203 | 194 | −34 |
| | 195 | 228 | 234 | −39 |

NOTE: Reference spacing, Sr=175, is used to set resist targets Rj.

FIG. 6B

| DESIGNED | MEASURED | COMPUTED | INFERRED | CURVE FIT |
|---|---|---|---|---|

FIG. 6

METHOD FOR GENERATING A PROXIMITY MODEL BASED ON PROXIMITY RULES

BACKGROUND OF THE INVENTION

1. Field of the Invention

The present invention generally relates to semiconductor chip fabrication, and more particularly to a method for generating an optical proximity correction (OPC) model for printing a circuit pattern on a photoresist layer of a semiconductor wafer. The invention is also an optical lithography system which generates an OPC model of this type.

2. Description of the Related Art

Model-based and hybrid rules/model-based optical proximity correction schemes are becoming the standard in the industry. In many situations, and especially when applying assist features, it makes the most sense to use a rules-based approach to apply some corrections followed by a model-based correction to clean up any problem spots. In order for this scheme to work, the rules and model must be compatible, so that the model-based correction does not find errors with the desired rules-based corrections.

OPC models are typically broken into two sections. One section describes the aerial image that is expected from a given wafer pattern and the other section describes the effects of the mask making and lithography/etch processes. OPC models of this type are calibrated by measuring the dimensions of known test structures exposed on a wafer. The aerial images of the test structures are then computed and the difference between these and the measured structures is used to determine the process model.

More sophisticated methods have been proposed to generate rules tables for a rules-based approach to optical proximity correction. Although not widely used, it has been shown that a process window analysis can be used to determine an optimum rules table. See Mansfield et al., Lithographic Comparison of Assist Feature Design Strategies, Proc. SPIE 4000, (2000). The benefit of this method is that it can be extended to account for expected mask and stepper lens errors, as well as process variations.

In view of the foregoing considerations, it is clear that a need exists for a method of generating an OPC model that is not only compatible with a sophisticated rules generation method, but also is able to take advantage of this additional sophistication.

SUMMARY OF THE INVENTION

It is a first object of the present invention to provide a method for generating an improved OPC model for correcting errors in the image of an integrated circuit formed on a resist layer of a semiconductor wafer.

It is another object of the present invention to achieve the first object by, first, generating a set of correction rules and then generating the OPC model based on the set of correction rules, which is a different and more effective approach than the conventionally taken which conversely to the invention first generates a model and then generates a set of correction rules based on that model. One advantage of the approach taken by the invention derives from the use of sophisticated rules generation methods which determine correction rules that account for variations in mask and wafer processes. Conventional methods used to generate OPC models do not account for such process variations.

It is another object of the present invention to provide a method for is generating an OPC model which is not only compatible with a sophisticated rules generation method but also is able to take advantage of this additional sophistication.

It is another object of the present invention to provide a method for generating an OPC model which is based on optimizing the process window to print features of interest.

It is another object of the present invention to provide a method for generating an OPC model where the process window includes the effects of process variations, mask errors, and errors in the exposure tools used.

It is another object of the present invention to generate an OPC model based on OPC rules.

It is another object of the present invention to use a process window analysis to generate rules to create an OPC model.

It is another object of the present invention to use designed lines at a reference spacing to create resist target dimensions from which the OPC model is generated.

It is another object of the present invention to create an input table with fixed resist sizes and variable line sizes to calibrate an OPC model.

The foregoing and other objects of the invention are achieved by a method which generates an optical proximity correction (OPC) model in accordance with steps that include generating a set of correction rules for a wafer design containing a multitude of lines separated from each other by various spacings, determining a set of corrections that need to be made over a range of sizes and spaces of said lines based on the set of correction rules, and then creating an optical proximity correction model for correcting the wafer design based on the set of corrections. This methodology works equally well for photomask designs that either do or do not utilize sub-resolution assist features. Preferably, the correction rules are generated using a process window analysis, although a line-width analysis may also be used.

BRIEF DESCRIPTION OF THE DRAWINGS

FIGS. 6A and 6B show, respectively, two tables containing model calibration data for the industry standard method and the rules-based method.

DESCRIPTION OF THE PREFERRED EMBODIMENTS

Figure 1:
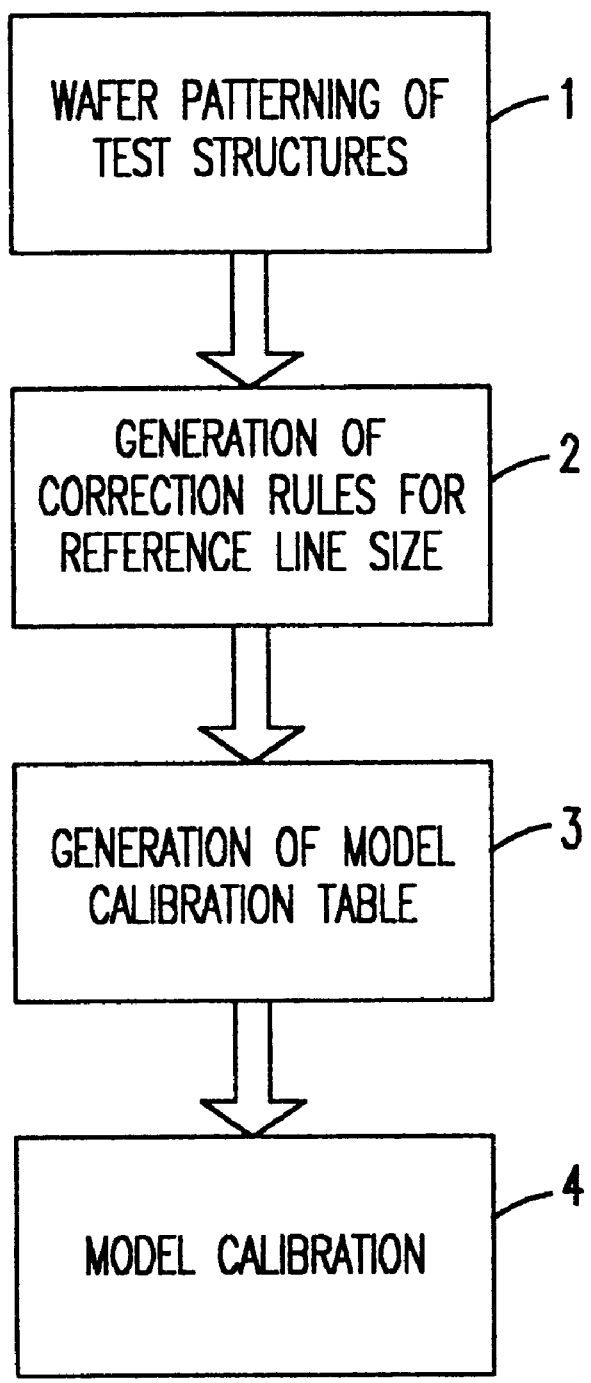
FIG. 1 is a flow diagram showing steps included in preferred embodiment of the method of the present invention.

Referring to FIG. 1, a preferred embodiment of the method of the present invention for generating an optical proximity model may be performed in four steps. The method begins by exposing test patterns, transferring these patterns onto a silicon wafer and then measuring their size. (Block 1).

A second step is to analyze the measurement data to create an OPC rules table. (Block 2). In addition to line width corrections, this table could define the placement and size of sub-resolution assist features. As explained in greater detail below, correction rules in the OPC table may be generated using a process window analysis such as disclosed in co-pending U.S. patent application Ser. No. 09/754,910 the contents of which are incorporated by reference herein.

A third step involves further analyzing the measurement data to create entries for a model calibration table. (Block 3). This table preferably contains entries that relate printed wafer dimensions with design dimensions.

A fourth step includes using this table to calibrate an imaging model that may then be used to apply optical proximity corrections to a photomask design. (Block 4).

Figure 2:
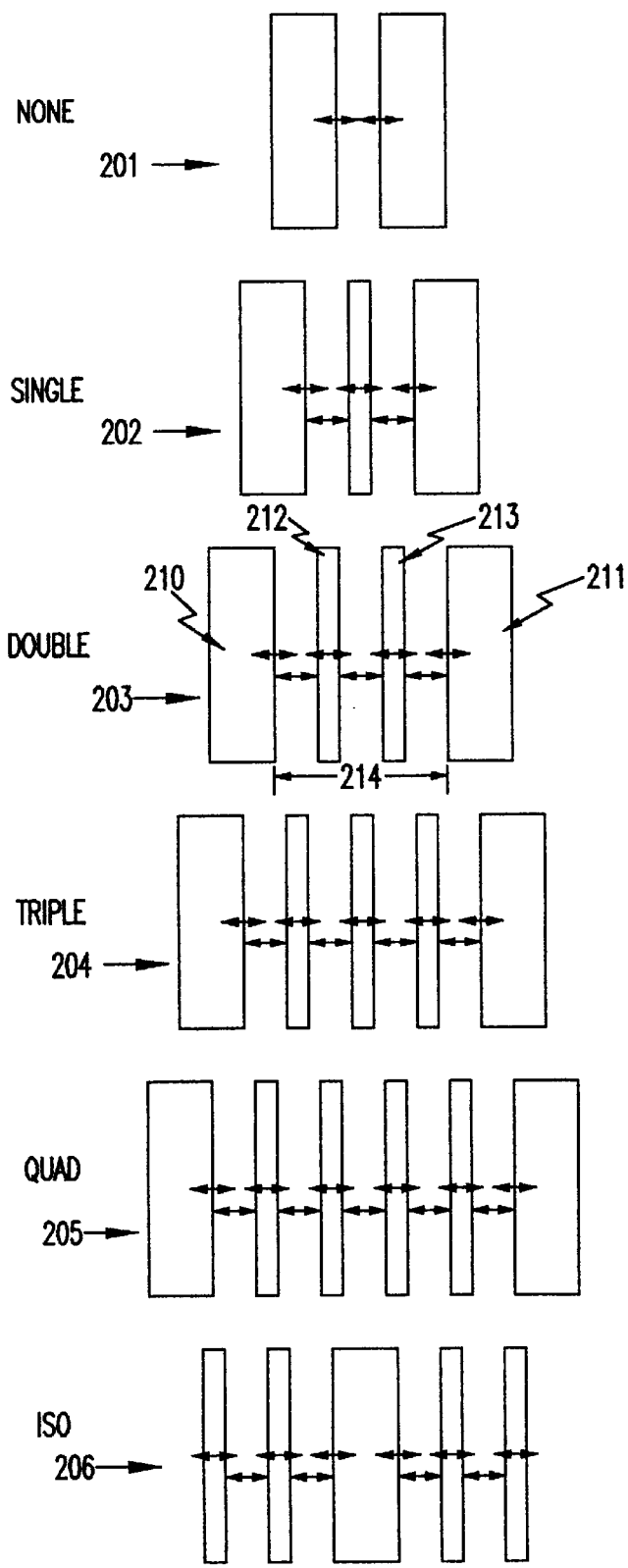
FIG. 2 shows example test structures (or patterns) that may be used to generate OPC and assist feature rules.

Taking each of these steps specifically, examples of test patterns (or test structures) exposed in the first step are shown in FIG. 2. Here, various line-space patterns 201–206 are shown with the spacing between lines generally increasing from the top of the figure to the bottom. In addition to the main designed features, some spacings have been drawn including sub-resolution assist features. These features are sub-resolution shapes that do not print on the wafer, but rather help to improve the process window to print the main features. An integrated circuit design would only include main features and it is the function of the OPC software of the present invention to add assist features as required.

For example, shapes 210 and 211 represent main features that exist in the IC design and which are separated by spacing 214. They will typically be patterned onto a photomask as opaque lines on a clear background. If the IC design is modified by OPC software, sub-resolution assist features such as 212 and 213 may be added to the design. These assist features will be subsequently patterned onto the photomask as opaque lines, along with the main features. However, since the assist features are sub-resolution, their image will not be transferred onto the wafer during the ensuing wafer processing step. The presence of assists, however, will affect the aerial image which is projected onto the wafer, so as to make the image of an isolated line behave more like a nested line when process variables such as focus and dose are adjusted. In this way, the process window to print lines at various spacings can be made to better coincide.

Although it is a function of the OPC software to properly add assist features to a design, this software must be given a set of rules which determine how this should be done. Typically, the OPC software will analyze the spacing between two designed main features and add the proper number of assist shapes into this space. As the spacing between the main features changes, not only can the number of assist features placed in this space change, but the size and location of these assists can also change. Likewise, the sizes of the main features can also be adjusted as the spacing between these features changes. All of the edges that can be varied are marked with a double-headed arrow.

The test patterns used in the first step should consist of various combinations of main and assist features, with the main feature spacing covering a range from essentially the minimum allowed in a design out to optically isolated. The combinations shown in FIG. 2 are examples. For proper model calibration, it is preferable that a thorough set of test patterns be used. The test patterns are described in the following discussion and, unless stated otherwise, it will be assumed that all required patterns will be available to analyze. Although FIG. 2 shows one-dimensional line-space patterns, those skilled in the art can appreciate that two-dimensional patterns such as line ends and corners could also be analyzed in accordance with the present invention.

The test patterns should be exposed into photoresist and transferred onto one or more silicon wafers using a focus-expose-matrix (FEM). Exposing an FEM allows the process window to print features to be computed, as the response of the wafer dimension to changes in focus and dose can be measured.

Figure 3A:
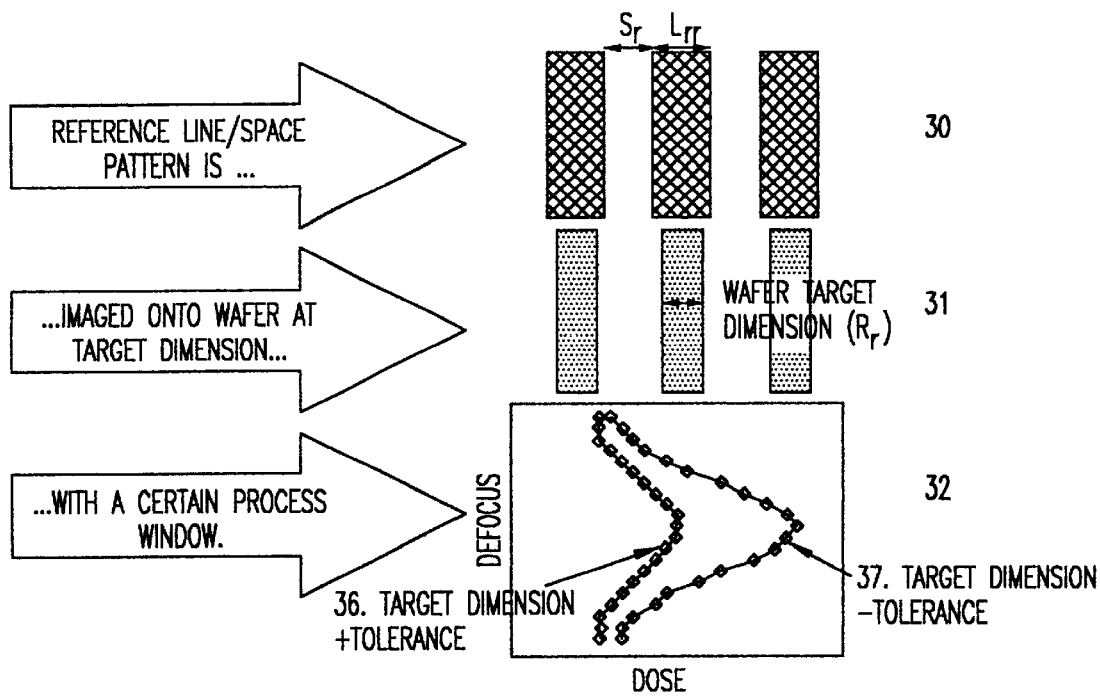
FIGS. 3A and 3B show a methodology of determining OPC and assist feature rules using a process window analysis.

The second step of the method involves the generation of OPC and assist feature rules. Having exposed and measured an FEM for test patterns in the first step, the measurement data may then be used to generate a rules table for optical proximity corrections (i.e., correction rules) as shown in FIG. 3. These rules are typically created at the minimum allowed line width in a design. Initially, a reference line space pattern 30 is analyzed (FIG. 3A). This pattern could consist of a nested pattern of lines where the line size equals the minimum allowed line size and the spacing between the lines equals the minimum allowed spacing.

Alternatively, the minimum allowable pitch (pitch equals line size plus space size) could be used, but the line:space ratio adjusted to maximize the process window to print features at a desired wafer dimension. Other patterns could also be chosen as the reference pattern and for this discussion, and it will be assumed that the reference pattern consists of a line size $L_T$ separated from other lines by a spacing $S_r$.

This line is printed on the wafer, at 31, at a dimension of $R_r$ with a corresponding process window, at 32. The process window is defined as the process conditions, namely focus and exposure dose, where a pattern prints within some tolerance of its desired size on the wafer, in this case $R_r$. To compute a process window, the size of the pattern on the wafer should be measured as the exposure dose and focus are varied, as in an FEM. By way of curve fitting, functional forms can be fit to this data which specify the printed wafer dimension as a function of focus and exposure dose. From these functions, the process conditions can be determined at which the wafer dimension equals its desired, or target, dimension plus or minus its wafer size tolerance.

These process conditions form two distinct curves 36 and 37. Curve 36 represent the focus and dose combinations that result in the wafer dimension equaling the target dimension plus the wafer size tolerance. Likewise, curve 37 represent the process conditions where the wafer dimension equals the target dimension minus the size tolerance. This tolerance is typically set at ±10% of the desired dimension. The process conditions (combinations of focus and dose) contained within the size tolerance curves represent the process window in which the feature prints within tolerance on the wafer. The process window to print the reference pattern ($L_r$, $S_r$) at the reference target dimension $R_r$ is referred to as the reference process conditions.

Figure 3B:
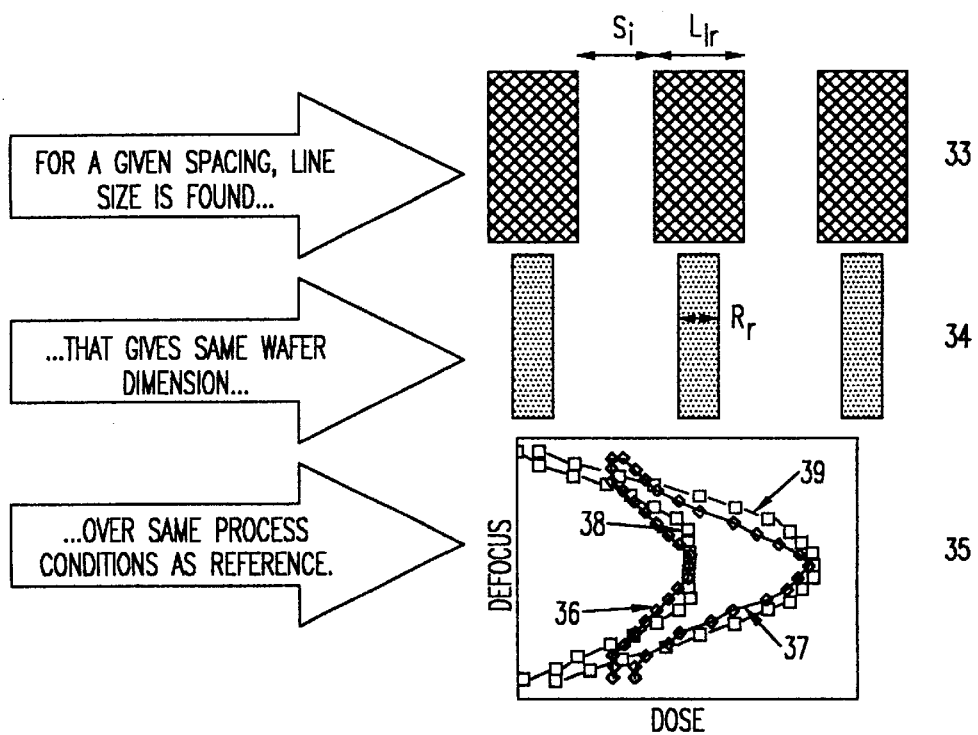

Having found the process window to print a reference pattern at a desired wafer dimension in FIG. 3A, FIG. 3B illustrates a method to use this process window to determine a set of correction rules in accordance with the present invention. Specifically, as the line width on the mask is increased, it will tend to print larger on the wafer for a given process condition (focus and dose). Likewise, to print this larger line at a desired wafer dimension, the process conditions must shift from those corresponding to a smaller line printed at the same dimension. So, for a given spacing $S_i$, the best overlapping process window with the reference pattern, at 35, is found by adjusting the line width, $L_{i,r}$ at 33, until the process conditions to print the feature on size, at 34, overlap the reference process conditions. The process conditions to print the feature within its wafer size tolerance are bounded by curves 38 and 39.

For some spacings $S_i$, there may be room to fit one or more assist features into the space between the two main features. In this case, changing the size or location of the assist(s) will affect the process window to print the feature in a manner similar to the main feature line width change. So, the assist sizes and placements, along with the main feature size, can be adjusted to give the best overlapping process window with the reference process conditions. By fitting curves to the process window as a function of the OPC parameters (line width, and assist size and placement), the optimum parameters can be found, even if these conditions do not exist in the set of exposed test patterns.

Using this process window methodology, a set of line sizes ($L_{ir}$), and, where appropriate, assist feature sizes and placements, can be found for a set of spacings $S_i$ that span a range from the minimum allowable spacing out to optically isolated. (Here, the subscripts i and j represent indices for sets of variables. The subscript r is used to specify a single index value corresponding to the reference values. Note that a variable with multiple indices, such as $L_{ij}$, can take on $N_i$ times $N_j$ values, where $N_i$ and $N_j$ are the number of values in the sets indexed by i and j, respectively. However, if one index is r, such as $L_{ir}$, then this variable can only take on $N_i$ values, since r is fixed.) All of these values make up a set of correction rules that are a function of spacing between main features.

Figure 4A:
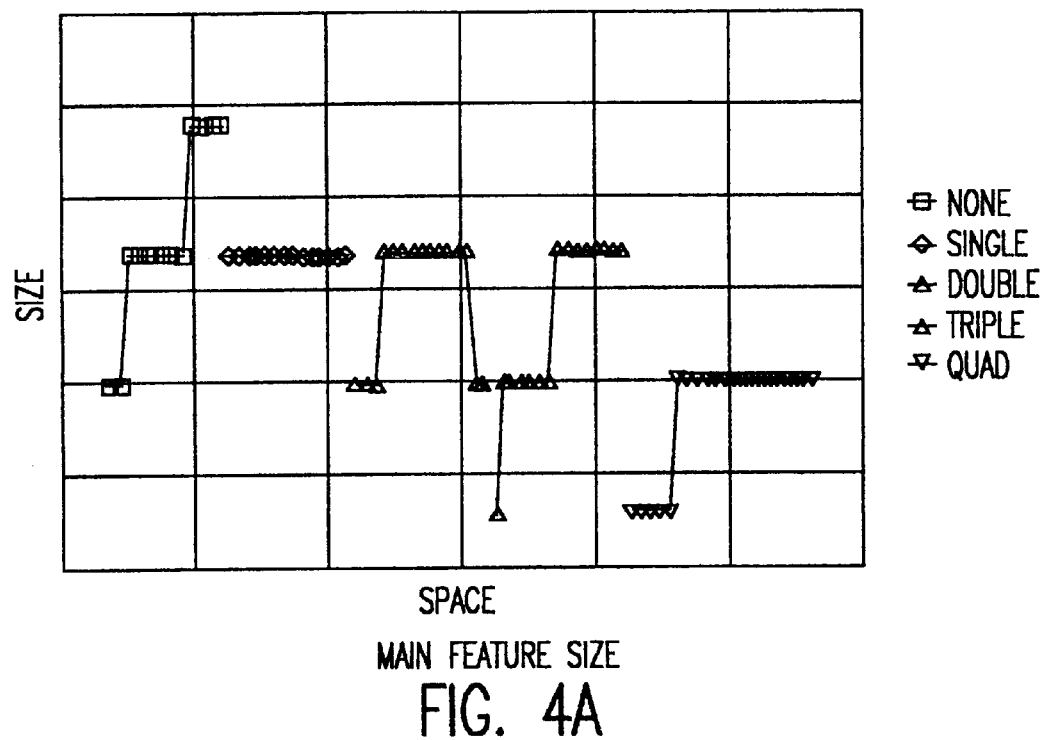
FIG. 4A shows an example of conventional correction rules for the main feature size.
Figure 4B:
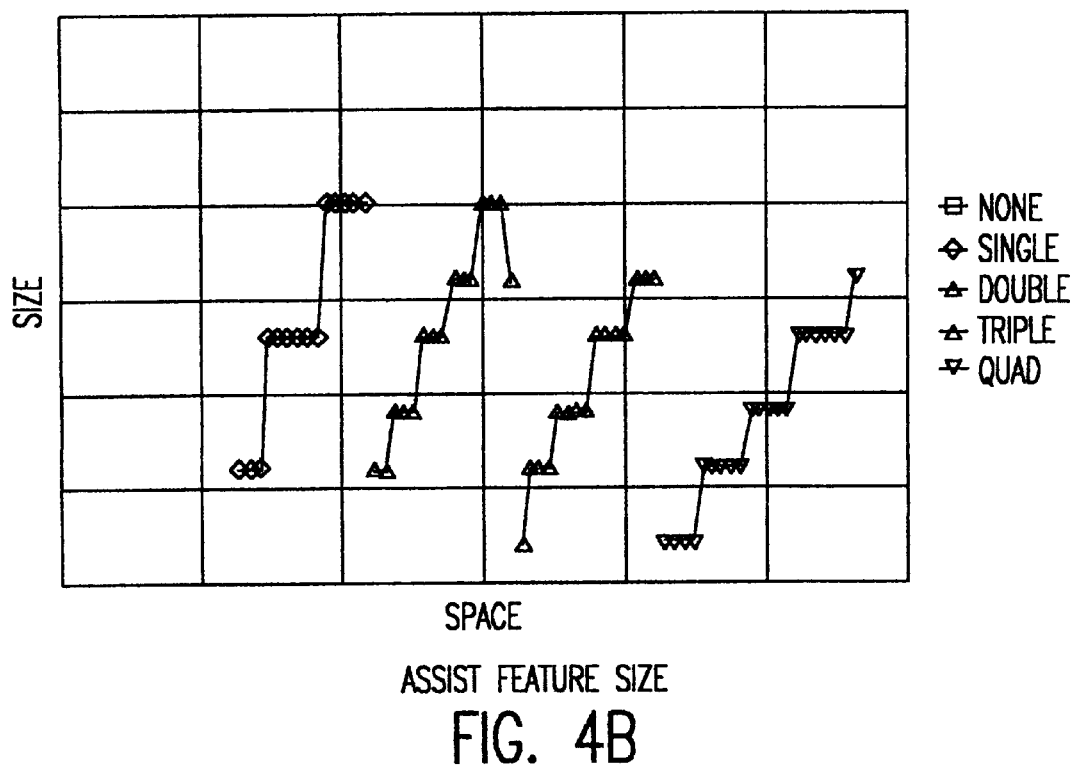
FIG. 4B shows the assist feature size as a function of spacing between main features.

A graphical example of these rules is shown in FIGS. 4A and 4B, where main feature size and assist feature size are respectively plotted as a function of spacing. The breaks in the curves represent points where the number of assist features used in the given space changes. The rules have also been snapped to a discrete grid that is related to the product design grid, which typically is an integer fraction of the design grid, e.g., one-fourth.

Although the previously described method of generating correction rules is preferred, many other methods may also work. Regardless of how they are derived, once the correction rules are determined, they can be used to generate a model calibration table. The method to do this is described in FIG. 5.

Figures 5A, 5B:
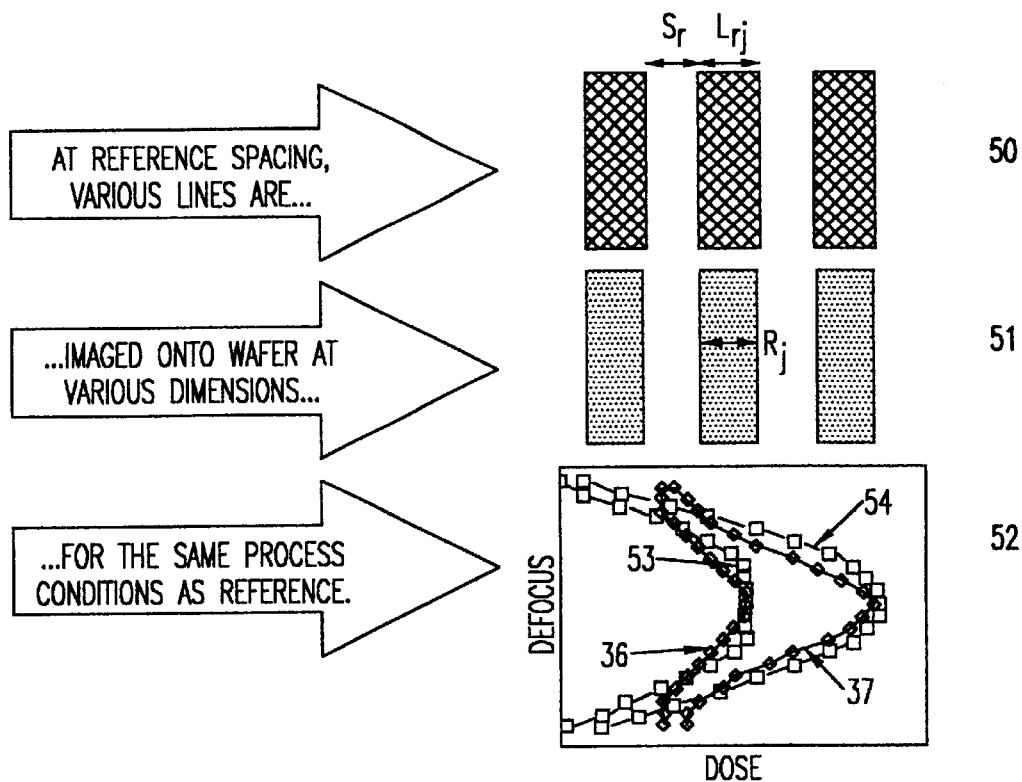
FIGS. 5A and 5B show the methodology for generating model calibration data.

According to FIG. 5A, at the reference spacing $S_r$, a set of lines, at 50, of various sizes on the photomask, $L_{rj}$, are imaged onto the wafer, at 51. As previously discussed, different sized lines on the mask will tend to print at different sizes on the wafer for a given set of process conditions. So, for each line, $L_{rj}$, a resist size $R_j$ can be found so that the process conditions bounded by the target plus tolerance and the target minus tolerance curves, 53 and 54, provide the best overlap with the reference process conditions. In this way, a set of resist dimensions, $R_j$, are determined that correspond to a set of lines, $L_{rj}$, at the reference spacing, $S_r$.

The resist dimensions, $R_j$, are then used in FIG. 5B to find the optimum line width, $L_{ij}$, at an arbitrary spacing, $S_i$. In a manner similar to that used to generate the correction rules in FIG. 3B, the line width, at 55, is varied so that the process conditions to print the feature at the resist dimensions, $R_j$ at 56, overlap the reference process conditions, at 57. Here, again, curve fitting to the process window as a function of line width can be used to find the optimum line width, even if this condition does not exist in the set of exposed test patterns. If the spacing, $S_i$, is large enough to require one or more assist features, the method used to determine the assist sizes and placements, along with the main feature line widths, for the resist sizes, $R_j$, may deviate slightly from the method used to generate the correction rules.

According to one embodiment of the method of the present invention, the assist feature sizes and placements for a given space $S_i$ are constrained to the values found in the correction rules. The benefit of this method is that it fits well with current OPC models and software, which work best when the assist features are placed by only examining the space between critical lines, not the lines themselves.

One way to achieve this is to examine only the line-space combinations ($L_{ij}$, $S_i$) that include the appropriate assist features, as determined for the given spacing $S_i$, according to FIGS. 3B and 4. Unfortunately, in reality, the set of available test structures does not always allow for the exact assist sizes and placements to be used. (The most basic reason for this is that test structures are often designed on a lithography test mask that has a design grid that differs from that of product designs. The correction rules are ultimately determined at a grid related to the product design grid, not the test mask design grid).

In this case, various assist sizes and placements can be examined for each spacing, $S_i$, and a response surface (curve fit) be found for each of the assist feature parameters (sizes and locations), along with the line sizes under examination. One approach to this would be to find the response surface for the size of the process window as a function of line width and assist parameters. The optimum line size, $L_{ij}$, can then be found by determining the maximum of this surface, while constraining the assist sizes and placements to those determined by the correction rules for the given spacing, $S_i$.

If sophisticated OPC models and software are used that can allow assist feature parameters to vary as a function of more variables than just the spacing between two main features, it may be desirable to have the assist parameters optimized specifically for each resist size $R_j$ and spacing $S_i$. This may be accomplished through a straightforward generalization of the response surface approach, where instead of constraining the assist parameters to those found for the correction rules, these values are left unconstrained and all values are found by finding the maximum of the response surface.

The output of the steps described to this point can be entered into a table of values that is used to calibrate an imaging model, as described in the fourth step. Example tables for both the industry standard method and the rules-based method are shown in FIG. 6.

In the industry standard method shown in FIG. 6A, the wafer dimensions $R_{ij}$, for a set of line-space combinations ($L_{ij}$, $S_i$) are measured at a fixed focus and dose condition. The line and space sizes, therefore, fall on the test mask design grid and the measured wafer dimensions are not constrained to any grid. These patterns are then simulated, using aerial image simulation and a simple resist model, and a size determined for each of the aerial image patterns, $A_{ij}$.

The delta from the aerial image size to the measured wafer size, Dij, can then be determined by subtracting the measured wafer size, $R_{ij}$, from the aerial image size, $A_{ij}$. This delta value is then fit to a functional form and this function is used as a process model to account for the wafer processing effects that are not captured in the aerial image computation. The combination of the aerial image computation and the process model make up an imaging model that can accurately predict how a designed pattern will be transferred onto a wafer at the given focus and dose conditions.

Although the industry standard method of model calibration has the benefit of simplicity, it falls short in its abilities to account for process variations. Specifically, in the method of determining OPC and assist feature correction rules described in U.S. patent application Ser. No. 09/754,910 and, previously, in regard to FIGS. 3 and 4, process variations such as focus and dose, have been accounted for when determining the optimum correction rules. Although not described here, the referenced patent application also describes how other variations, such as mask CD errors and lens aberrations, can also be accounted for using this method.

The result of these sophisticated rules generation methods, is a design correction strategy that does not attempt to print all features at their desired wafer dimension for a fixed focus and dose condition. Instead, the common process window to print all features within their wafer tolerances is optimized. If these rules are to be extended into a model based OPC correction, then the model calibration must be compatible with these rules.

Figure 7:
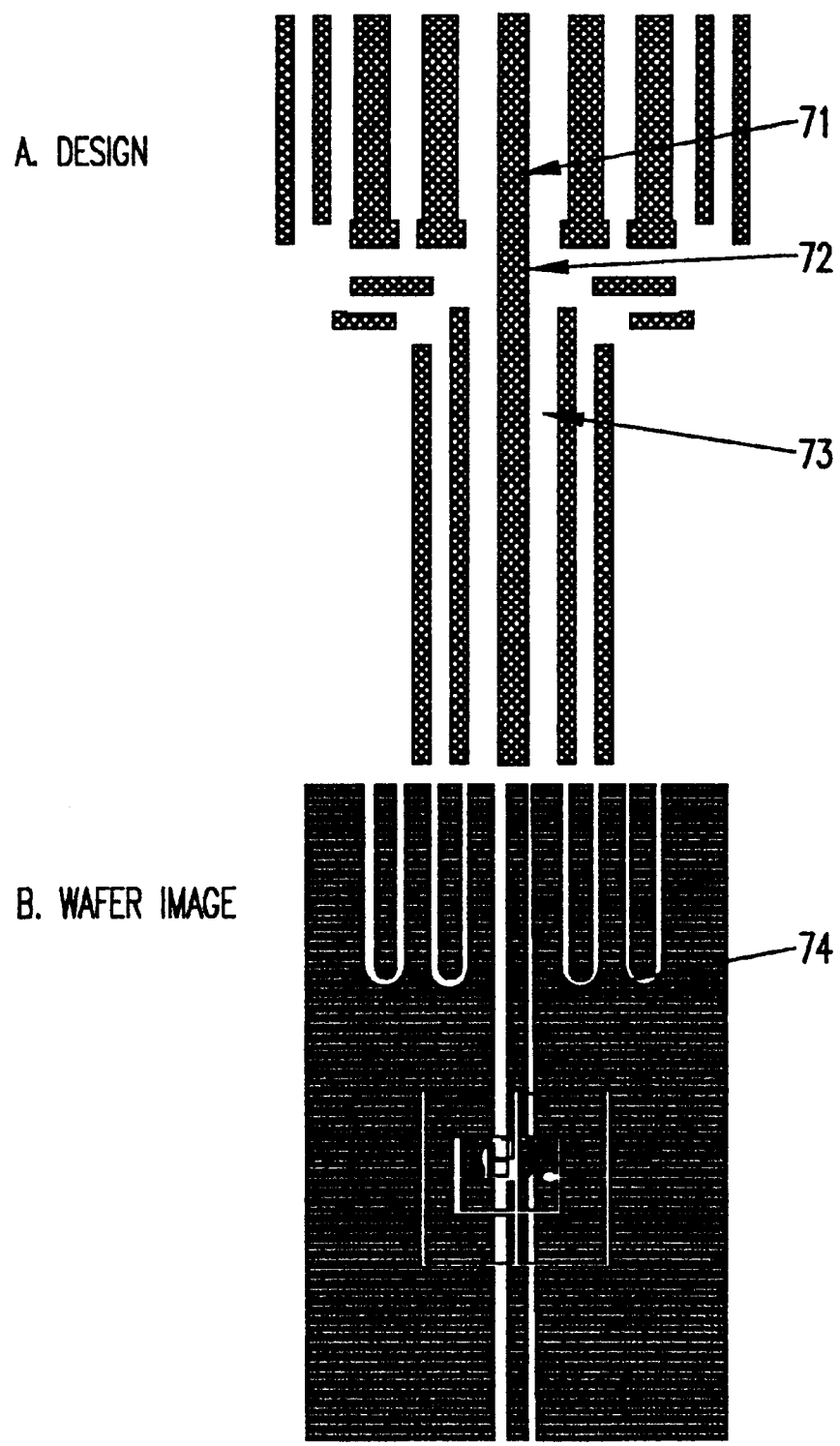
FIG. 7 is a sample design layout and corresponding wafer image showing the need for model-based OPC on an assist feature layout.

An example of the need for this is shown in FIG. 7. Here, assist features have been added to a design using a rules-based OPC routine. Due to the two-dimensional aspect of the design, the correction close to the fan-out region, 72, is insufficient and necking of the wafer image is observed, 74. Following the rules-based correction with a model-based correction would improve the performance of the fan-out region, but it is important that it not "re-correct" the primarily one-dimensional line space regions, 71 and 73.

FIG. 6B, shows a model calibration table that ensures this compatibility. In this case, only a relatively small number of measured wafer dimensions $R_j$ are utilized in the table. These correspond to the values found in FIG. 5A for various line widths $L_t$ at the reference spacing $S_r$. These wafer dimensions are then re-used for the various spacings $S_i$ and the appropriate line widths $L_{ij}$ determined by curve fitting, as described in regard to FIG. 5B.

In this way, the resist values are constrained to a small set, while the line widths are allowed to vary freely without being constrained to a design grid. With the mask patterns and wafer image sizes determined, the model calibration can then proceed as in the industry standard method. The line-space combinations ($L_{ij}$, $S_i$) are again simulated and a size determined from the aerial image $A_{ij}$. The delta from the aerial image to the wafer image $D_{ij}$ is then fit to a function to create the process model.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

We claim:

1. A method for generating an optical proximity correction (OPC) model, comprising:
   (a) transferring at least one mask test pattern onto a wafer test pattern at a first focus and dose;
   (b) measuring size data for the at least one wafer test pattern, said size data corresponding to a reference line size and reference spacing on said mask test pattern;
   (c) providing a set of correction rules based on a product design grid for at least one additional reference line size and for at least one additional reference spacing;
   (d) creating a model calibration table from said set of correction rules, said model calibration table including second line size and second spacing at a second focus and dose corresponding to said size data in accordance with said set of correction rules; and
   (e) calibrating an OPC model based on said model calibration table.

2. The method of claim 1, wherein said at least one test pattern includes line-space patterns.

3. The method of claim 1, wherein said at least one test pattern includes main features and assist features.

4. The method of claim 1, wherein step (a) includes transferring a plurality of test patterns onto the wafer, and wherein said size data is determined based on said plurality of test patterns.

5. The method of claim 1, wherein said at least one test pattern is transferred onto said wafer using a focus-expose-matrix.

6. The method of claim 1, wherein in step (c), said set of correction rules is generated using a process window analysis.

7. The method of claim 1, wherein said test patterns include two-dimensional structures.

8. The method of claim 1, further comprising applying optical proximity corrections to a photomask design based on said OPC model.

9. A method for generating an OPC model, comprising:
   (a) providing a set of optical proximity correction (OPC) rules based on a product design grid;
   (b) creating a model calibration table based on said set of OPC rules; and
   (c) calibrating an OPC model based on said model calibration table.

10. The method of claims 9, further comprising:
    transferring at least one test pattern having at least one design dimension onto a wafer at a first process condition;
    measuring size data for the at least one test pattern on said wafer; and
    wherein said step of creating a model calibration table further comprises generating at least one second design dimension for at least one second process condition different from said first process condition so that said at least one second design dimension corresponds to said size data in accordance with said set of OPC rules.

11. The method of claim 9, wherein said model calibration table includes information indicative of printed wafer dimensions with wafer design dimensions.

12. The method of claim 9, wherein said set of OPC correction rules is generated using a process window analysis.

13. The method of claim 9, wherein said set of OPC rules further includes rules for placing subresolution assist features.

* * * * *